US012616026B2

(12) United States Patent
Atadana et al.

(10) Patent No.: US 12,616,026 B2
(45) Date of Patent: Apr. 28, 2026

(54) PERMANENT LAYER FOR BUMP CHIP ATTACH

(71) Applicant: Intel Corporation, Santa Clara, CA (US)

(72) Inventors: Frederick Atadana, Hillsboro, OR (US); Jean Bosco Kana Kana, Chandler, AZ (US); Shripad Gokhale, Gilbert, AZ (US); Xavier F. Brun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 366 days.

(21) Appl. No.: 18/071,961

(22) Filed: Nov. 30, 2022

(65) Prior Publication Data

US 2024/0178097 A1 May 30, 2024

(51) Int. Cl.
| | |
|---|---|
| *H01L 23/373* | (2006.01) |
| *H01L 21/48* | (2006.01) |
| *H01L 23/00* | (2006.01) |
| *H01L 23/15* | (2006.01) |
| *H01L 23/538* | (2006.01) |
| *H01L 25/065* | (2023.01) |
| *H10W 40/25* | (2026.01) |
| *H10W 70/60* | (2026.01) |
| *H10W 70/63* | (2026.01) |
| *H10W 70/692* | (2026.01) |
| *H10W 90/00* | (2026.01) |
(Continued)

(52) U.S. Cl.
CPC ........ *H10W 40/259* (2026.01); *H10W 70/611* (2026.01); *H10W 70/635* (2026.01); *H10W 70/692* (2026.01); *H10W 90/00* (2026.01);

*H10W 90/401* (2026.01); *H10W 99/00* (2026.01); *H10W 74/15* (2026.01); *H10W 90/724* (2026.01); *H10W 90/734* (2026.01)

(58) Field of Classification Search
CPC . H01L 23/3731; H01L 23/15; H01L 23/5384; H01L 23/5385; H01L 25/0655
See application file for complete search history.

(56) References Cited

U.S. PATENT DOCUMENTS

| | | | |
|---|---|---|---|
| 6,952,049 | B1 | 10/2005 | Ogawa et al. |
| 8,872,349 | B2 | 10/2014 | Chiu et al. |
| 9,740,079 | B1 | 8/2017 | Davids et al. |
(Continued)

FOREIGN PATENT DOCUMENTS

CN 102820268 A 12/2012

OTHER PUBLICATIONS

Coining-Ametek press release, "Solder Melting Temperature What Is It, and Why Is It Important," retrieved from https://www.ametek-coining.com/pressreleases/blog/2020/september/what-is-solder-melting-point on Jan. 23, 2026, published Sep. 16, 2020 (Year: 2020).

(Continued)

*Primary Examiner* — Peniel M Gumedzoe
(74) *Attorney, Agent, or Firm* — Akona IP PC

(57) ABSTRACT

Disclosed herein are microelectronics package architectures utilizing glass layers and methods of manufacturing the same. The microelectronics packages may include a silicon layer, dies, and a glass layer. The silicon layer may include vias. The dies may be in electrical communication with vias. The glass layer may include interconnects in electrical communication with the vias.

24 Claims, 5 Drawing Sheets

NONCRITICAL FUNCTION BUMPS (NCTF) AT CORNERS WITH DUMMY ROUTING

CRITICAL/ ELECTRICALLY ACTIVE BUMPS

(51) Int. Cl.
 *H10W 99/00* (2026.01)
 *H10W 74/15* (2026.01)

(56) References Cited

U.S. PATENT DOCUMENTS

| | | | |
|---|---|---|---|
| 10,698,164 | B2 | 6/2020 | Psaila et al. |
| 12,066,671 | B2 | 8/2024 | Tang et al. |
| 2006/0169973 | A1 | 8/2006 | Isa et al. |
| 2010/0030496 | A1 | 2/2010 | Vianna |
| 2010/0187683 | A1 | 7/2010 | Bakir et al. |
| 2010/0244230 | A1 | 9/2010 | Oi |
| 2011/0304999 | A1* | 12/2011 | Yu ........................... H01L 25/03 |
| | | | 29/829 |
| 2014/0078704 | A1* | 3/2014 | Andry ..................... H05K 1/18 |
| | | | 361/764 |
| 2014/0339705 | A1* | 11/2014 | Yee .................. H01L 21/76877 |
| | | | 257/774 |
| 2016/0374198 | A1* | 12/2016 | Kim ..................... H05K 1/0271 |

| | | | |
|---|---|---|---|
| 2018/0102311 | A1 | 4/2018 | Shih |
| 2018/0344245 | A1 | 12/2018 | Knickerbocker et al. |
| 2019/0074240 | A1 | 3/2019 | Levesque, Jr. et al. |
| 2019/0124772 | A1 | 4/2019 | Stahr et al. |
| 2020/0027728 | A1 | 1/2020 | Wang et al. |
| 2020/0203266 | A1 | 6/2020 | Iwai et al. |
| 2021/0118698 | A1 | 4/2021 | Sawadaishi |
| 2021/0257741 | A1 | 8/2021 | Flemming et al. |
| 2023/0187205 | A1 | 6/2023 | Wang et al. |

OTHER PUBLICATIONS

Ungarish, M. et al."Dielectric cure monitoring and optimization of film adhesives," International Journal of Adhesion and Adhesives 11.2 (1991): 87-91. (Year 1991).

Wiemer, M. et al."Wafer bonding with BCB and SU-8 for MEMS packaging," 2006 1st Electronic Systemintegration Technology Conference, vol. 2, IEEE, 2006. (YEar: 2006).

* cited by examiner

○ NONCRITICAL FUNCTION BUMPS (NCTF) AT CORNERS WITH DUMMY ROUTING

◉ CRITICAL/ ELECTRICALLY ACTIVE BUMPS

PERMANENT LAYER FOR BUMP CHIP ATTACH

FIELD OF THE DISCLOSURE

The present subject matter relates to microelectronics packages. More specifically, the present disclosure relates to microelectronics with a permanent layer for multi-logic bump chip attachment and package side bump chip attachment packages and methods of manufacturing the same.

BACKGROUND

Current solder-based chip attachment to a silicon layer is limited by in plane heat transfer loss for small die bonding. The current solution relies on increasing bond head temperatures and pedestal temperatures that reduce the process and reliability window. Small dies, less than 10 mm², are not able to hit solder melt temperature due to the higher surface area to volume ratio for heat loss.

BRIEF DESCRIPTION OF THE FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Disclosed herein is glass layer usage at the silicon layer level attach to maintain in plane heat. This enhances solder to melt at the lower bond head (BH) and pedestal temperatures. At package side bump (PSB) the layer may be thinned to a thickness for passivation and PSB bumping. Dummy routing may be enabled in top passivation layers. The glass layer may be made from silicon monoxides/silicon nitrides (SiO/SiN) with much lower thermal conductivity compared to pure silicon (Si).

As disclosed herein, a silicon layer may include through silicon vias and dies in electrical communication with the vias. A glass layer can include interconnects in electrical communication with the through silicon vias to allow power or signals to be transferred from a substrate through the interconnects of the glass layer to the dies. The glass layer can provide both mechanical and thermal stability due to the properties of glass.

The above discussion is intended to provide an overview of the subject matter of the present patent application. It is not intended to provide an exclusive or exhaustive explanation. The description below is included to provide further information.

Figure 1A:
FIGS. 1A, 1B, and 1C show a microelectronics package in accordance with at least one example of this disclosure.
Figure 1A:
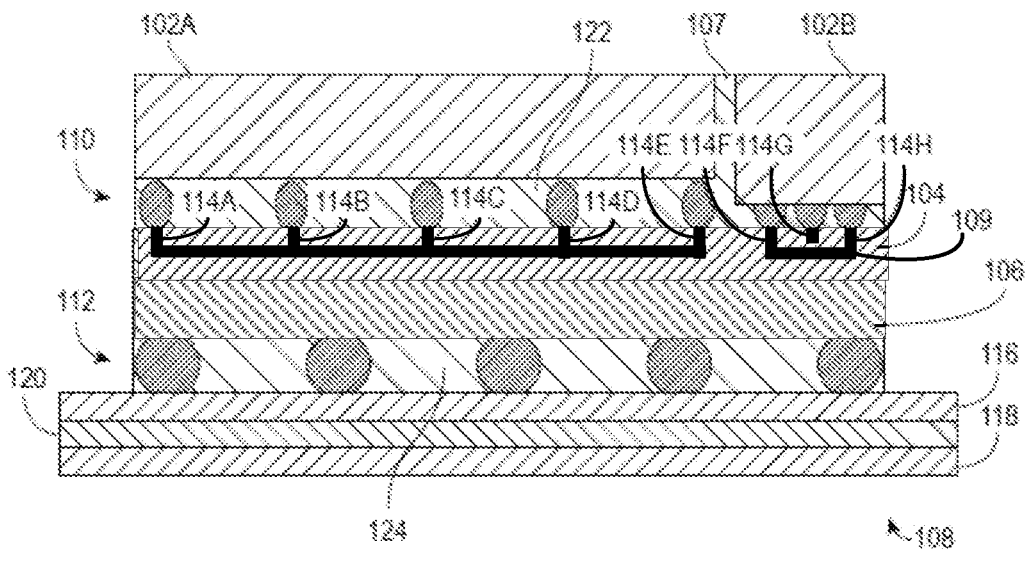

Turning now to the figures, FIG. 1A shows a microelectronics package 100 in accordance with at least one example of this disclosure. Microelectronics package 100 may include dies 102 (labeled individually as dies 102A and 102B), a silicon layer 104, a glass layer 106, and another substrate 108. Substrate 108 may be connected to glass layer 106 on a side opposite silicon layer 104. Silicon layer 104 may be connected to dies 102 with interconnects or bumps 110 and to substrate 108 with interconnects or bumps 112. A mold material 107 may cover dies 102, silicon layer 104, and glass layer 106.

Silicon layer 104, may have vias 114 (labeled individually as vias (114A, 114B, 114C, 114D, 114E, 114F, 114G, and 114H), sometimes referred to as through silicon vias (TSVs). Vias 114 may be divided into subsets of vias. For example, vias 114A, 114B, 114C, 114D, and 114E may be a first subset of vias used to provide electrical communication pathways between die 102A and glass layer 106 and vias 114F and 114G may be a second subset of vias used to provide electrical communication pathways between die 102B and glass layer 106.

Subsets of vias 114, such as vias 114F and 114H may relate to a dummy routing trace 109. Dummy routing trace 109 may be noncritical and/or non-functional trace and the vias connected to dummy routing trace 109 (i.e., vias 114F and 114H) may be noncritical and/or non-functional vias. Dummy components may be included to provide physical properties, but not electrical connections such as power, ground, or data interconnections. In one example, dummy components such as dummy traces and/or dummy bumps are included to provide additional physical force distribution. In one example, dummy components such as dummy traces and/or dummy bumps are included to provide a heat distribution or heat sink function. Dummy components may be referred to as non-functional in the sense that they do not provide any electrical connections. In such as sense, dummy components do provide a mechanical and/or thermal function, although they do not provide an electrical function.

As disclosed herein, glass layer 106 may include interconnects, which may be plated interconnects, that are connected to vias 114 to allow power and signals to be transmitted between the substrate 108 and dies 102 through glass layer 106. Stated another way, the interconnects may provide electrical communication pathways between substrate 108 and silicon layer 104.

Substrate 108 may include a first organic layer 116 and a second organic layer 118. Although three layers of substrate 108 are shown, the invention is not so limited. Additional dielectric layers, conductor layers, and vias between layers may be utilized to route and re-direct signals/power through substrate 108 for subsequent connection to a circuit board, such as a mother board. A glass layer 120 may be located in between the first organic layer 116 and the second organic layer 118. Glass layer 106 of FIG. 1 may be referred to as a permanent carrier layer in the sense that layer 106 may be a remnant portion of a glass carrier utilized in the assembly of package 100.

A underfill material 122, which may be an epoxy, may be located in between dies 102 and silicon layer 104. Underfill 122 may be used to protect bumps 110 located in between dies 102 and silicon layer 104. An epoxy 124 may be located in between glass layer 106 and first organic layer 116. Underfill material 122 and epoxy 124 may be used to provide mechanical strength between component, in addition to electrical connections such as bumps 110, 112.

Figure 1B:
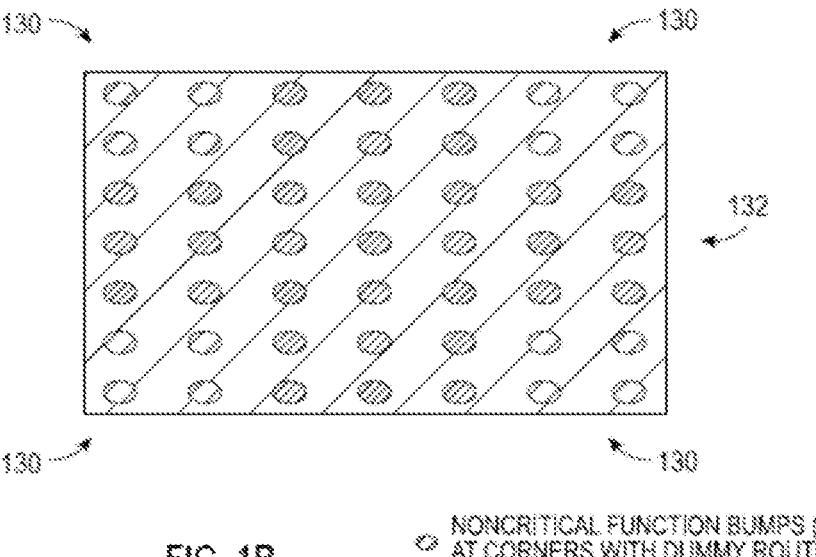
Figure 1C:
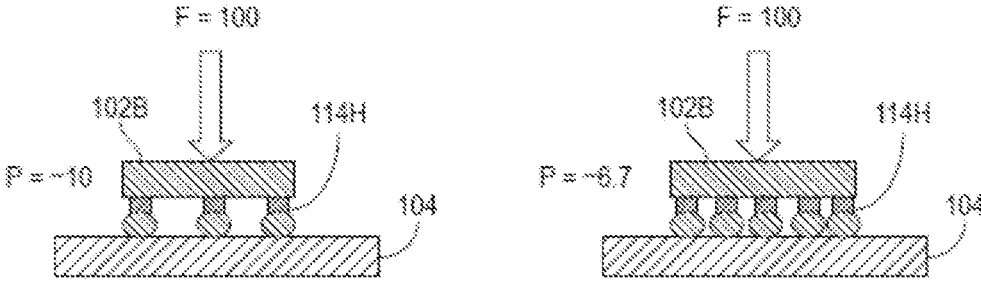

The architecture shown in FIGS. 1A, 1B, and 1C and disclosed herein, may enable lower bonding temperature process ranges due to a level of thermal insulation provided by glass layer 106. The coefficient of thermal expansion (CTE) match between a glass substrate disclosed herein and tile stacks, which may be referred to as integrated circuit (IC) dies, chiplet stacks, etc.) reduces temperature cycling failures due to balancing CTE forces. Dummy routing at the corners as shown in FIG. 1B may improve bonding density for controlled collapse chip connection (C4) and also prevent yield loss from improper formed joints at the corners. Epoxy flow may be enhanced with an increase in C4 density, leading to improved assembly yield and a more consistent chip gap height.

FIG. 1B shows a plan view of microelectronics package 100 in accordance with at least one example of this disclosure. As shown in FIG. 1B, microelectronics package 100 may include non-functional bumps 130 and electrically active bumps 132. During a bonding process bumps located at the corners of microelectronics package 100 may lose heat faster than other bumps. The faster loss of heat may cause the bumps located at the corner to not form proper joints. As disclosed herein, non-functional bumps 130 may be located at the corners of microelectronics package 100 so that should there be improper joints formation, electrical function of microelectronics package 100 is not affected.

The use of glass layer 106 may help to retain heat within microelectronics package 100 during a bonding process. As shown in FIG. 1C, the extra bumps provided by non-functional bumps 130, can allow for pressure distribution during pick process for bonding, due to having larger number of bumps per area for the same force. This leads to smaller force on each bump and helps prevent bump deformation during the pick process at higher temperature.

Figure 2A:
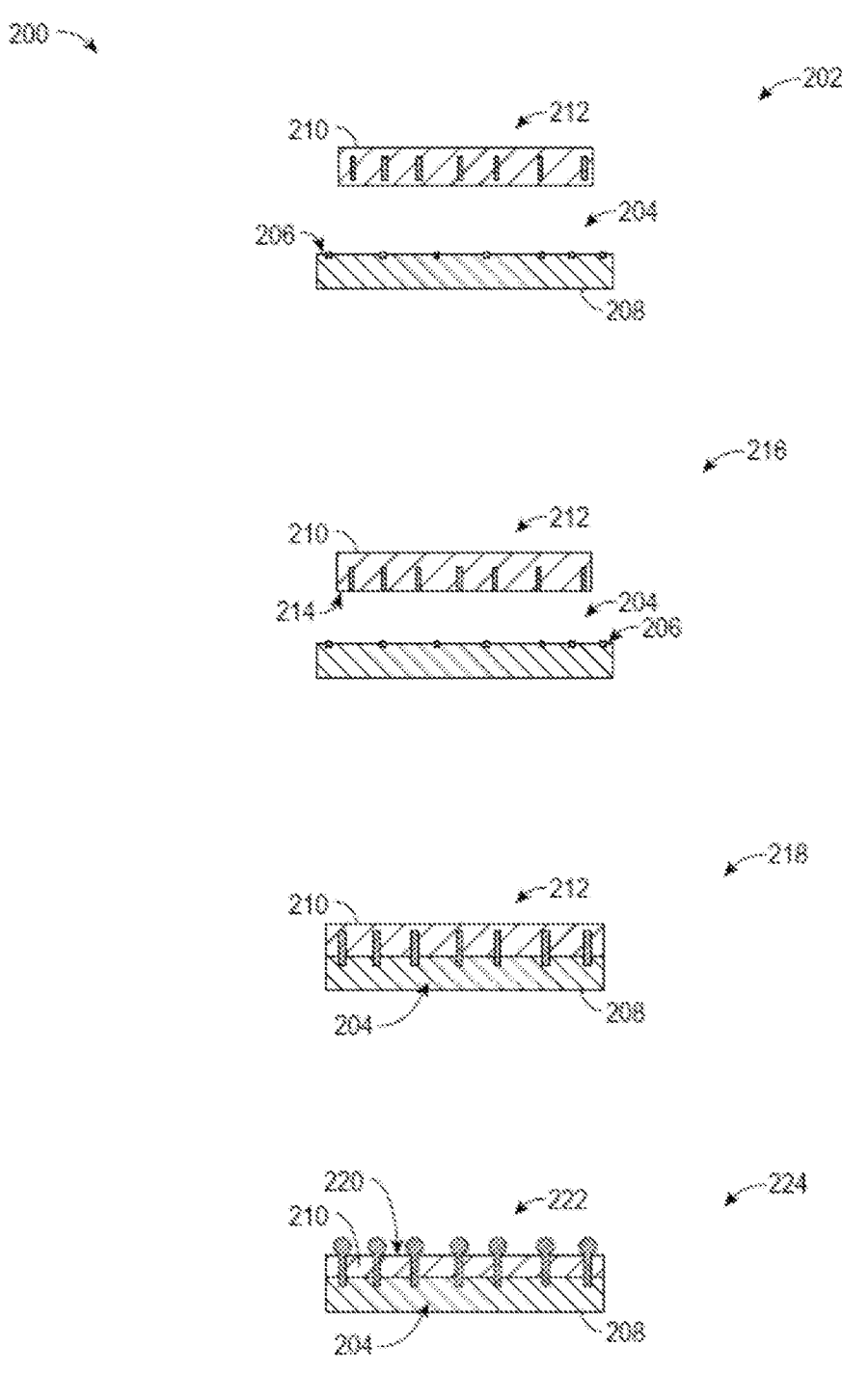
FIGS. 2A and 2B show a process for manufacturing a microelectronics package utilizing a glass layer in accordance with at least one example of this disclosure.
Figure 2B:
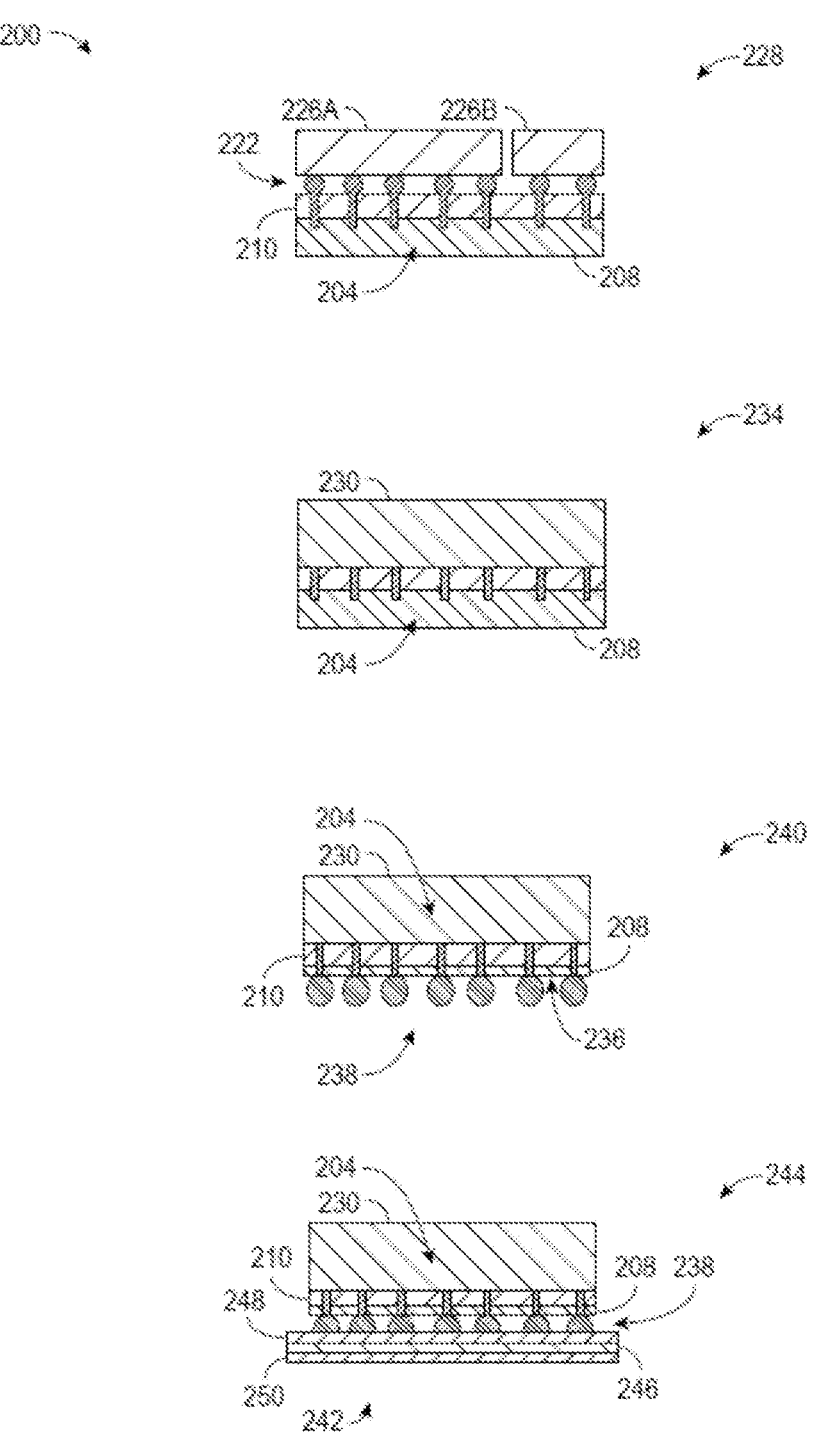

FIGS. 2A and 2B shows a process flow 200 for manufacturing a microelectronics package utilizing a glass layer. Process flow 200 may begin at stage 202, where interconnects 204 may be formed on a surface 206 of a glass layer 208. Interconnects 204 may be formed by a plating, sputtering, or other deposition process. A silicon layer 210 may be provided that includes vias 212.

Silicon layer 210 may include vias 212 such as through silicon vias formed during process flow 200. For example, a surface 214 of silicon layer 210 may be etched to reveal a first end of vias 212 along surface 214 of silicon layer 210 (216). To connect silicon layer 210 to glass layer 208 (218), surface 214 may be located adjacent to or in contact with glass layer 208 after attaching silicon layer 210 to glass layer 208 such that vias 212 form electrical pathways with interconnects 204.

Once silicon layer 210 is attached to glass layer 208, surface 220 may be thinned to reveal TSV's followed by package side bumping to form bumps 222 (224). Once bumps 222 are formed, dies 226 (labeled individually as dies 226A and 226B) may be attached to silicon layer 210 (228). After attaching dies 226, a mold layer 230 may be formed (234). Mold layer 230 may encapsulate dies 226 and may be in contact with silicon layer 210.

A surface 236 of silicon layer 210 may be thinned to reveal vias 204 and bumps 238 may be formed (240). A substrate 242 may be formed and attached to glass layer 208 using bumps 238 (244). Substrate 242 may include a glass layer 246 located in between a first organic layer 248 and a second organic layer 250.

Process flow 200 may enable use of a glass layer for improved small die bonding on glass substrate architecture. Glass layer 208 may be attached to thinner incoming silicon layer 210. As disclosed herein, a top side (surface 220) of silicon layer 210 may go through TSV reveal and C4 bumping for subsequent chip (dies 226) attachment to silicon layer 210. Post epoxy and mold process (234), the silicon layer 210 may be thinned down (240) to reveal TSV's for subsequent bumping, and attaching to glass substrate (244).

Figure 3:
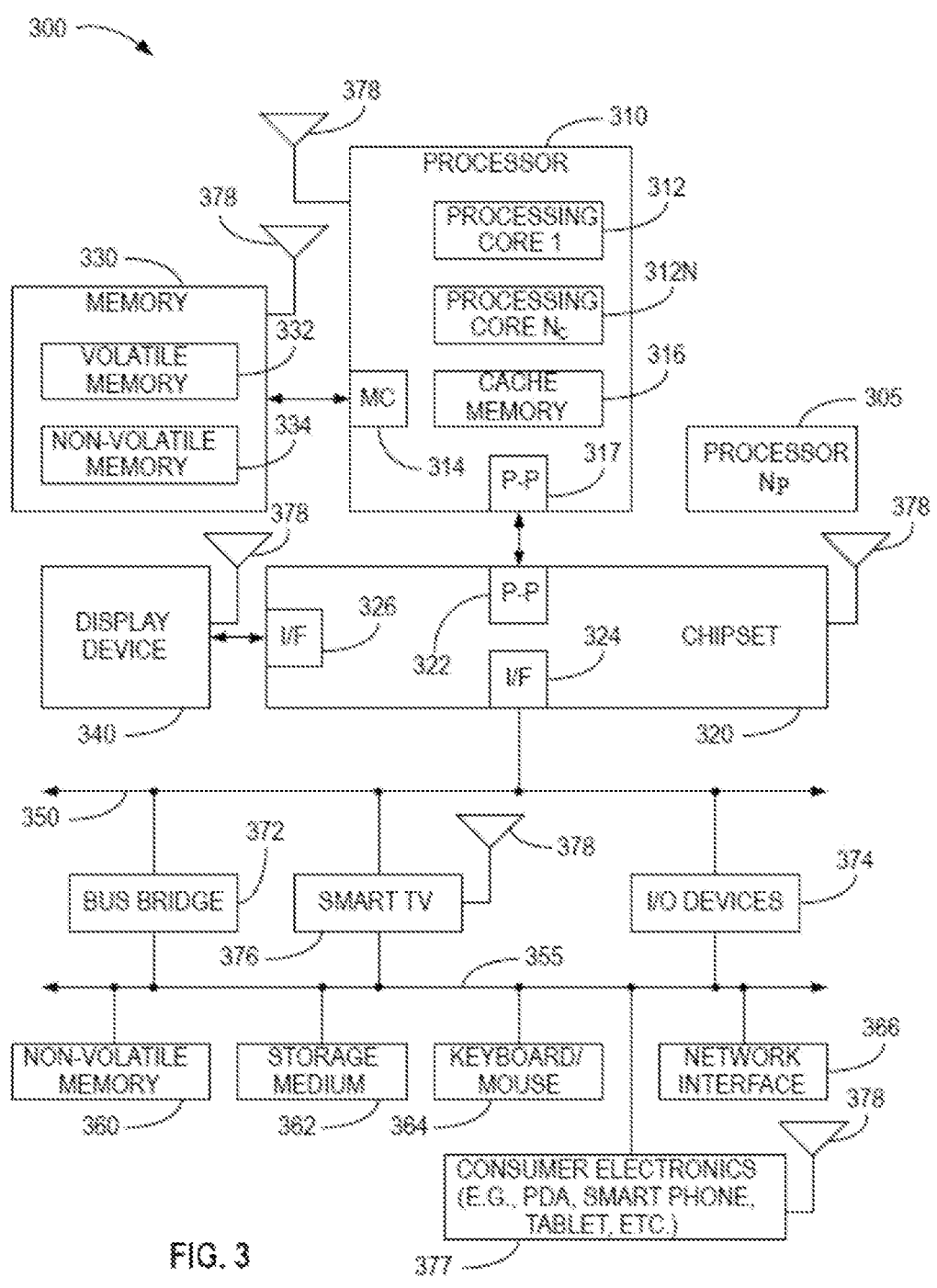
FIG. 3 shows a system level diagram in accordance with at least one example of this disclosure.

FIG. 3 illustrates a system level diagram, according to one embodiment of the present disclosure. For instance. FIG. 3 depicts an example of an electronic device (e.g., system) including microelectronics package 100 as described herein. FIG. 3 is included to show an example of a higher-level device application for the present disclosure. In one embodiment, system 300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 300 is a system on a chip (SOC) system.

In one embodiment, processor 310 has one or more processing cores 312 and 312N, where 312N represents the Nth processor core inside processor 310 where N is a positive integer. In one embodiment, system 300 includes multiple processors including 310 and 305, where processor 305 has logic similar or identical to the logic of processor 310. In some embodiments, processing core 312 includes, but is not limited to, pre-fetch logic to fetch instructions, decode logic to decode the instructions, execution logic to execute instructions and the like. In some embodiments, processor 310 has a cache memory 316 to cache instructions and/or data for system 300. Cache memory 316 may be organized into a hierarchal structure including one or more levels of cache memory.

In some embodiments, processor 310 includes a memory controller 314, which is operable to perform functions that enable the processor 310 to access and communicate with memory 330 that includes a volatile memory 332 and/or a non-volatile memory 334. In some embodiments, processor 310 is coupled with memory 330 and chipset 320. Processor 310 may also be coupled to a wireless antenna 378 to communicate with any device configured to transmit and/or receive wireless signals. In one embodiment, the wireless antenna interface 378 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 334 includes, but is not limited to, flash memory, phase change memory (PCM), read-only memory (ROM), electrically erasable programmable read-only memory (EEPROM), or any other type of non-volatile memory device.

Memory 330 stores information and instructions to be executed by processor 310. In one embodiment, memory 330 may also store temporary variables or other intermediate information while processor 310 is executing instructions. In the illustrated embodiment, chipset 320 connects with processor 310 via Point-to-Point (PtP or P-P) interfaces 317 and 322. Chipset 320 enables processor 310 to connect to other elements in system 300. In some embodiments of the present disclosure, interfaces 317 and 322 operate in accordance with a PtP communication protocol such as the Intel® QuickPath Interconnect (QPI) or the like. In other embodiments, a different interconnect may be used.

In some embodiments, chipset 320 is operable to communicate with processor 310, 305N, display device 340, and other devices 372, 376, 374, 360, 362, 364, 366, 377, etc. Chipset 320 may also be coupled to a wireless antenna 378 to communicate with any device configured to transmit and/or receive wireless signals.

Chipset 320 connects to display device 340 via interface 326. Display 340 may be, for example, a liquid crystal display (LCD), a plasma display, cathode ray tube (CRT) display, or any other form of visual display device. In some embodiments of the present disclosure, processor 310 and chipset 320 are merged into a single SOC. In other embodiments, processor 310 and chipset 320 may be part of a disaggregated collection of discrete dies (e.g., chiplets, tiles, IC dies, etc.) interconnected into a package assembly. In addition, chipset 320 connects to one or more buses 350) and 355 that interconnect various elements 374, 360, 362, 364, and 366. Buses 350 and 355 may be interconnected together via a bus bridge 372. In one embodiment, chipset 320 couples with a non-volatile memory 360, a mass storage device(s) 362, a keyboard/mouse 364, and a network interface 366 via interface 324 and/or 304, smart TV 376, consumer electronics 377, etc.

In one embodiment, mass storage device 362 includes, but is not limited to, a solid state drive, a hard disk drive, a universal serial bus flash memory drive, or any other form of computer data storage medium. In one embodiment, network interface 366 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 3 are depicted as separate blocks within the system 300, the functions performed by some of these blocks may be integrated within a single semiconductor circuit or may be implemented using two or more separate integrated circuits. For example, although cache memory 316 is depicted as a separate block within processor 310, cache memory 316 (or selected aspects of 316) can be incorporated into processor core 312.

ADDITIONAL NOTES

The following, non-limiting examples, detail certain aspects of the present subject matter to solve the challenges and provide the benefits discussed herein, among others.

Example 1 is a microelectronics package. The microelectronics package includes a silicon layer comprising a first subset of through vias, and a second subset of through vias. The microelectronics package includes a first die in electrical communication with the first subset of through vias, a second die in electrical communication with the second subset of through vias, and a glass layer comprising interconnects in electrical communication with the first and second subsets of through vias.

Example 2 includes the microelectronics package of example 1, further comprising a substrate connected to the glass layer on a side opposite the silicon layer.

Example 3 includes the microelectronics package of any one of examples 1-2, wherein the substrate comprises first and second layers of an organic material, and a glass layer located in between the first and second layers of the organic material.

Example 4 includes the microelectronics package of any one of examples 1-3, wherein the substrate is a glass substrate.

Example 5 includes the microelectronics package of any one of examples 1-4, further comprising an underfill material located in between the first and second dies and the silicon layer.

Example 6 includes the microelectronics package of any one of examples 1-5, further comprising an epoxy located in between the glass layer and the silicon layer.

Example 7 includes the microelectronics package of any one of examples 1-6, wherein the glass layer includes silicon and oxygen.

Example 8 includes the microelectronics package of any one of examples 1-7, further comprising a dummy routing trace in the silicon layer.

Example 9 includes the microelectronics package of any one of examples 1-8, further comprising non-functional bumps.

Example 10 is a microelectronics package. The microelectronics package includes a silicon layer comprising through silicon vias, a dummy routing trace in the silicon layer, a plurality of dies, each of the plurality of dies in electrically coupled with the respective ones of the through silicon vias, at least one of the plurality of dies electrically coupled to the dummy routing trace, and a glass layer comprising interconnects in electrical communication with the through silicon vias.

Example 11 includes the microelectronics package of example 10, further comprising a substrate connected to the glass layer on a side opposite the silicon layer.

Example 12 includes the microelectronics package of any one of examples 10-11, wherein the substrate comprises first and second layers of an organic material, and a second glass layer located in between the first and second layers of the organic material.

Example 13 includes the microelectronics package of any one of examples 10-12, further comprising a underfill material located in between the first and second dies and the silicon layer.

Example 14 includes the microelectronics package of any one of examples 10-13, further comprising an epoxy located in between the glass layer and the silicon layer.

Example 15 includes the microelectronics package of any one of examples 10-14, further comprising a thermal paste located in between the glass layer and the silicon layer.

Example 16 includes the microelectronics package of any one of examples 10-15, further comprising at least one via electrically coupling the at least one of the plurality of dies to dummy routing layer.

Example 17 includes the microelectronics package of any one of examples 10-16, further comprising non-functional bumps.

Example 18 is a method of manufacturing a microelectronics package. The method includes forming in interconnects on a surface of a glass layer, attaching a silicon layer having through vias to the glass layer with the interconnects in electrical communication with the through vias, attaching dies to the silicon layer, and forming a mold layer that encapsulates the dies and is in contact with the silicon layer.

Example 19 includes the method of example 18, further comprising forming a substrate comprising a glass layer in between two organic layers.

Example 20 includes the method of any one of examples 18-19, further comprising attaching the substrate to the glass layer.

Example 21 includes the method of any one of examples 18-20, further comprising etching the silicon layer to reveal the through vias along a surface of the silicon layer, the surface located adjacent to or in contact with the glass layer after attaching the silicon layer to the glass layer.

Example 22 includes the method of any one of examples 18-21, further comprising etching an opposite surface of the silicon layer, the opposite surface located adjacent to or in contact with at least one of the dies after attaching the dies to the silicon layer.

Example 23 includes the method of any one of examples 18-22, further comprising forming a dummy routing layer.

Example 24 includes the method of any one of examples 18-23, further comprising forming non-functional bumps.

The above detailed description includes references to the accompanying drawings, which form a part of the detailed description. The drawings show, by way of illustration, specific embodiments in which the present disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the present disclosure should be determined with reference to the appended claims, along with the full scope of equivalents to which such claims are entitled.

What is claimed is:

1. A microelectronics package, comprising:
a silicon layer comprising:
   a first subset of through vias, and
   a second subset of through vias;
a first die in electrical communication with the first subset of through vias;
a second die in electrical communication with the second subset of through vias;
a glass layer comprising interconnects in electrical communication with the first and second subsets of through vias; and
non-functional bumps.

2. The microelectronics package of claim 1, further comprising a substrate attached to the glass layer on a side opposite the silicon layer, wherein the substrate includes:
   first and second layers of an organic material; and
   a glass layer located in between the first and second layers of the organic material.

3. The microelectronics package of claim 1, further comprising a glass substrate attached to the glass layer on a side opposite the silicon layer.

4. The microelectronics package of claim 1, further comprising an underfill material between the first die and the silicon layer, and between the second die and the silicon layer.

5. The microelectronics package of claim 1, further comprising an epoxy between the glass layer and the silicon layer.

6. The microelectronics package of claim 1, wherein the glass layer includes silicon and oxygen.

7. The microelectronics package of claim 1, further comprising a dummy routing trace in the silicon layer.

8. A microelectronics package, comprising:
a silicon layer comprising through vias;
a dummy routing trace in the silicon layer;
a plurality of dies, wherein each of the plurality of dies is conductively coupled with respective ones of the through vias, and wherein at least one of the plurality of dies is conductively coupled with the dummy routing trace; and
a glass layer comprising interconnects, wherein the interconnects are conductively coupled with the through vias.

9. The microelectronics package of claim 8, further comprising a substrate attached to the glass layer on a side opposite the silicon layer, wherein the substrate includes:
   first and second layers of one or more organic materials; and
   a second glass layer between the first and second layers of the one or more organic materials.

10. The microelectronics package of claim 8, further comprising a underfill material between a first die of the plurality of dies and the silicon layer, and between a second die of the plurality of dies and the silicon layer.

11. The microelectronics package of claim 8, further comprising an epoxy between the glass layer and the silicon layer.

12. The microelectronics package of claim 8, further comprising a thermal paste between the glass layer and the silicon layer.

13. The microelectronics package of claim 8, further comprising at least one via conductively coupling the at least one of the plurality of dies and the dummy routing layer.

14. The microelectronics package of claim 8, further comprising non-functional bumps.

15. A microelectronics package, comprising:

a silicon layer comprising a first subset of through vias and a second subset of through vias;

a first die conductively coupled with the first subset of through vias;

a second die conductively coupled with the second subset of through vias;

a glass layer comprising interconnects conductively coupled with the first and second subsets of through vias; and an epoxy between the glass layer and the silicon layer.

16. The microelectronics package of claim 15, further comprising a dummy routing trace in the silicon layer.

17. The microelectronics package of claim 16, wherein at least one of the first die and the second die is conductively coupled with the dummy routing trace.

18. The microelectronics package of claim 15, further comprising non-functional bumps.

19. The microelectronics package of claim 15, further comprising a routing trace in the silicon layer, wherein the routing trace is not connected to any power, ground, or data interconnects.

20. The microelectronics package of claim 19, wherein at least one of the first die and the second die is conductively coupled with the routing trace.

21. The microelectronics package of claim 15, further comprising bumps, wherein the bumps are not connected to any power, ground, or data interconnects.

22. The microelectronics package of claim 15, further comprising a substrate attached to the glass layer on a side opposite the silicon layer, wherein the substrate includes:

first and second layers of an organic material; and a glass layer located in between the first and second layers of the organic material.

23. The microelectronics package of claim 15, further comprising a glass substrate attached to the glass layer on a side opposite the silicon layer.

24. The microelectronics package of claim 15, further comprising an underfill material between the first die and the silicon layer, and between the second die and the silicon layer.

\* \* \* \* \*